(12) United States Patent
Kubo

(10) Patent No.: US 7,486,120 B2
(45) Date of Patent: Feb. 3, 2009

(54) DELAY RATIO ADJUSTING CIRCUIT, DELAYED PULSE GENERATION CIRCUIT, AND PULSE WIDTH MODULATION PULSE SIGNAL GENERATION DEVICE

(75) Inventor: Hiroaki Kubo, Shiga-ken (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/757,614

(22) Filed: Jun. 4, 2007

(65) Prior Publication Data

US 2007/0285140 A1 Dec. 13, 2007

(30) Foreign Application Priority Data

Jun. 8, 2006 (JP) ............................. 2006-159889

(51) Int. Cl.
 *H03L 7/06* (2006.01)
(52) U.S. Cl. ..................... 327/158; 327/149; 327/156; 327/147
(58) Field of Classification Search ......... 327/156–159, 327/147–150, 172–177, 276, 393, 375, 376
See application file for complete search history.

(56) References Cited

U.S. PATENT DOCUMENTS

| | | | | |
|---|---|---|---|---|
| 5,477,196 | A * | 12/1995 | Yamauchi et al. | 331/60 |
| 6,677,792 | B2 * | 1/2004 | Kwak | 327/158 |
| 7,358,784 | B2 * | 4/2008 | Kim et al. | 327/158 |
| 2003/0102895 | A1 * | 6/2003 | Miller | 327/158 |
| 2003/0218486 | A1 * | 11/2003 | Kwak | 327/158 |
| 2005/0110671 | A1 * | 5/2005 | Lee et al. | 341/162 |
| 2006/0029175 | A1 * | 2/2006 | Schnarr | 375/376 |
| 2006/0076992 | A1 * | 4/2006 | Kim | 327/158 |
| 2006/0087354 | A1 * | 4/2006 | Minzoni | 327/158 |
| 2006/0132203 | A1 * | 6/2006 | Lee | 327/158 |

FOREIGN PATENT DOCUMENTS

| | | | |
|---|---|---|---|
| JP | 04-151968 A | | 5/1992 |
| JP | 04151968 | | 5/1992 |
| JP | 04151968 A | * | 5/1992 |
| JP | 06-204792 A | | 7/1994 |

(Continued)

*Primary Examiner*—Lincoln Donovan
*Assistant Examiner*—Adam Houston
(74) *Attorney, Agent, or Firm*—Matthew C Zehrer; Shimokaji & Associates, P.C.

(57) ABSTRACT

Object To provide a highly accurate and stable pulse width modulation (PWM) pulse signal generation device compatible with high resolution images without increasing a basic frequency of an external oscillation circuit.

Solving Means A PWM pulse signal generation device includes a first PLL control circuit 410, a ring oscillator 420 in which a plurality of basic delay elements are serially connected, and a delayed pulse generation circuit constituted by a delay ratio adjusting circuit 330 and a delay circuit 350. The delay circuit 350 is formed by setting one adjustment delay element having a delay ratio R that is adjusted by the delay ratio adjusting circuit 330 at a first stage and a plurality of serially connecting basic delay elements. An output pulse signal from each delay element of the ring oscillator 420 and an output pulse signal from each delay element of the delay circuit 350 having a delay amount corresponding to the delay ratio are superimposed to perform pulse width modulation, whereby output pulses having various pulse widths can be generated.

10 Claims, 13 Drawing Sheets

FOREIGN PATENT DOCUMENTS

| | | | | |
|---|---|---|---|---|
| JP | 06204792 A | * | 7/1994 | |
| JP | 09-046196 A | | 2/1997 | |
| JP | 11-263040 A | | 9/1999 | |
| JP | 11263040 A | * | 9/1999 | |
| JP | 2007329745 A | * | 12/2007 | |

* cited by examiner (Prior Art)

(Prior Art)

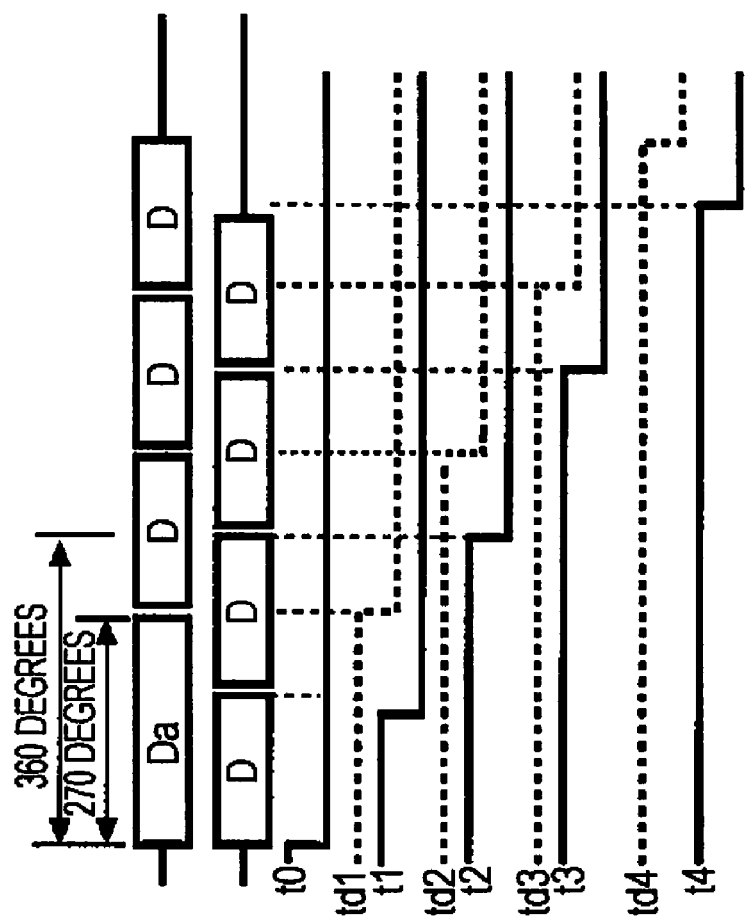

FIG. 8(b)

| n (RESOLUTION) | MINIMUM DELAY STEP | DELAY RATIO (NOTE) R | NUMBER OF DELAYED PULSE GENERATION CIRCUITS |
|---|---|---|---|
| 2 | 0.5 | $\frac{3}{2}$ | 1 |
| 4 | 0.25 | $\frac{5}{4}, \frac{6}{4}, \frac{7}{4}$ | 3 |
| 8 | 0.125 | $\frac{9}{8}, \frac{10}{8} \cdots \frac{15}{8}$ | 7 |
| ⋮ | ⋮ | ⋮ | ⋮ |

(NOTE) NUMERATOR = NUMBER OF BASIC (FIRST) DELAY ELEMENTS (D)

DENOMINATOR = NUMBER OF ADJUSTMENT DELAY ELEMENTS (Da1 TO Dan-1)

DELAY RATIO ADJUSTING CIRCUIT, DELAYED PULSE GENERATION CIRCUIT, AND PULSE WIDTH MODULATION PULSE SIGNAL GENERATION DEVICE

FIELD OF THE INVENTION

The present invention relates to devices for supplying pulse-width-modulated pulse output signals, and more specifically, it relates to a high-resolution-compatible PWM (pulse width modulation) pulse signal generation device that operates accurately and stably.

BACKGROUND OF THE INVENTION

Accuracy of amount of laser radiation can be improved by closely controlling on/off periods of light emitting devices, such as laser diodes, for use in laser printers or the like. It is possible to improve accuracy of radiation time and amount of radiation as periods, during which the light emitting devices are turned on and off, can be controlled more closely during a predetermined period. More specifically, when the control is performed using pulse width modulation (PWM), the accuracy of radiation time and amount of radiation can be improved as combination of various widths increases.

Generally, a pulse width modulation (PWM) pulse signal is generated in the following manner. As is the case of a PWM pulse signal generation device 100 employing a counter shown in FIG. 1, a base clock supplied from a base clock oscillator 10 is counted by a counter circuit 20. In a selector circuit 30 to which a preset counted value is input, if the counted value reaches a specified value set by PWM level setting, the selector circuit inverts ON/OFF (1/0) of output of the selector circuit. A PWM pulse waveform shaping circuit 40 generates pulse waveforms by combinations of ON/OFF. Although this method is a simple method, the number of combinations of various pulse widths is limited during one cycle specified by the base clock frequency, which makes it difficult to increase resolution. For example, in a case where a 10-bit pulse width modulation pulse waveform is generated, the base clock frequency is limited to approximately 200 MHz and the basic period is about 0.2 MHz from 200 MHz/ 1024. This is insufficient for a frequency required in practical application of laser printers or the like.

Due to a configuration that a base clock is counted by a counter, a constraint that the operation upper limit frequency of a counter composed of a plurality of logic circuits cannot be increased further is imposed on a PWM pulse signal generation device employing a counter circuit. Since a counter having more number of digits has to be produced to increase the resolution further, the logic circuits become more complex and the size of the logic circuits on a semiconductor circuit board becomes larger, which prevents the further increase in the frequency.

As means for increasing the frequency, there are PWM pulse signal generation devices employing a ring oscillator in which a plurality of inverters are connected in serial to create a ring and that oscillates. This is a method utilizing delay of logic circuits. The oscillation frequency is determined by a signal delay speed of delay elements, which are inverters. Since the frequency depends on the temperature, the voltage, etc., and accuracy of pulse width modulation is not obtained without any measures, ring oscillators are generally controlled by a PLL (phase lock loop) so that variation in the frequency is not caused.

FIG. 2(*a*) shows an example of a configuration of a PWM pulse signal generation device 200 employing a ring oscillator. A plurality of delay elements 211 to 214 are connected in serial. An output terminal of a last delay element is connected to an input terminal of a first delay element through an inverter (an inverting element) 216. A ring oscillator 220 is formed so that a desired base frequency can be divided equally utilizing signal propagation delay caused by the delay elements (D) 211 to 214. A width of an output pulse of each of the delay elements 211 to 214 is controlled by a control voltage V1 applied to each delay element. An oscillation frequency of the ring oscillator 220 is determined by a delay time of a delay element (D). Since the delay time is affected by disturbance, the ring oscillator 220 operates as a VCO (voltage controlled oscillator). A PLL (phase lock loop) is formed by a PLL control circuit 230 constituted by a phase comparator 232, a low-pass filter (e.g., integrator) 234, and a voltage control circuit 236 and stabilizes the oscillation frequency by locking the signal output from the ring oscillator to an external clock pulse input from an external oscillation circuit 240. The pulse signal output from each of the delay elements of the ring oscillator 220 is input to a selector circuit 250. After the selector circuit 250 selects either a non-inverted pulse or an inverted pulse, a pulse waveform shaping circuit 260 generates PWM pulse waveform with various pulse widths. FIG. 2(*b*) shows an example of a waveform of the output pulse from each delay element and PWM output pulses having performed pulse width modulation (PWM) in a case where the number of the delay elements is four. Pulses output from the delay elements (D) 211 to 214 at the first cycle are denoted as D0 (t0), D1 (t1), D2 (t2), D3 (t3), and D4 (t4). Pulses output at the second cycle are denoted as D0*, D1* and so on. As shown in the figure, at the second cycle, the pulse waveform is inverted. As examples of PWM output pulses, a PWM output 1 is obtained by operation of D1-D3 (subtraction) and a PWM output 2 is obtained by operation of D2-D1* (subtraction).

In this method, even when a ring oscillator with 512 stages is used, a basic period (a value obtained by dividing the base frequency by resolution) is limited to approximately 15 MHz. This method is generally used as a high-speed PWM pulse signal generation system currently. The basic period is shortened by lowering the resolution. That is, it is difficult to generate a pulse with a pulse width corresponding to a basic period not greater than a delay time that a delay element has, thus limiting the resolution.

A pulse width modulation (PWM) circuit capable of generating output signals having a uniform pulse width with respect to a given pixel clock and of being formed on one chip is disclosed in Japanese Unexamined Patent Application Publication No. 4-151968. In this patent document, a pulse width modulation circuit including (1) a voltage controlled oscillator VCO composed of a plurality of ring oscillators, (2) a tap selection circuit for selecting one signal having a waveform closest to that of a detect signal from output signals of each delay element of the VCO and for outputting an image clock, (3) a delay circuit including delay elements that are the same as those of the VCO, to which the control signal of the VCO being supplied similarly, and for outputting delay signals delayed by a predetermined time with respect to the pixel clock, (4) a waveform shaping circuit for forming pulse signals having pulse widths according to the outputs from this delay circuit, and (5) a waveform selection circuit for selecting an output signal corresponding to input image data from the output signals from the waveform shaping circuit, is disclosed. For example, when a clock having a phase shifted by T/8 is input to the waveform shape circuit, clock signals PWM1 to PWM7 having pulse widths of ⅛T, ¼T, . . . , and ⅞T are generated, respectively. That is, waveforms whose pulse widths are shifted by a constant time with respect to a given frequency T can be obtained. It is mentioned that multilevel image data is input to the waveform selecting circuit, whereby the corresponding PWM signal is selected. However, in this PWM circuit, an amount of delay cannot be set to a value not greater than an amount of delay (a delay time) that a delay element has, which does not lead to increase of the resolution.

DETAILED DESCRIPTION

Figure 1:
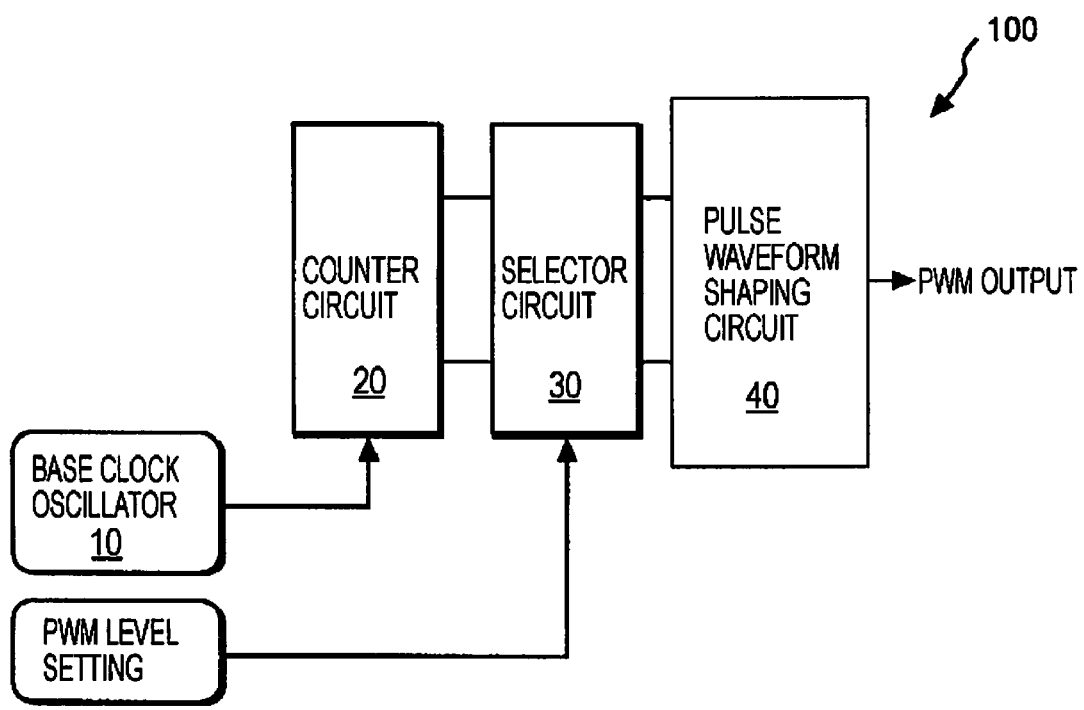
FIG. 1 is a diagram of a known pulse signal generation device for performing pulse width modulation (PWM)

In an application for laser printers or the like, it is necessary to closely control periods during which light emitting devices, such as laser diodes, are turned on and off during a specified period. Generally, pulse width modulation (PWM) is performed using a ring oscillator having a plurality of delay elements to generate various pulse widths, whereby this control is performed. In this case, the pulse widths cannot be adjusted to a period not greater than a delay time that the delay element has, which restricts increase of accuracy. To solve this problem, an embodiment of the present invention provides a high-resolution-compatible circuit for adjusting a delay time without increasing a base frequency of an external oscillation circuit and to provide a circuit for generating delayed pulsed whose delay times are adjusted.

Furthermore, another embodiment of the present invention describes a highly accurate and stable pulse width modulation (PWM) pulse signal generation device for allowing high-resolution image processing without increasing a base frequency of an external oscillation circuit when controlling turning on and off of laser diodes or the like.

Another embodiment of the present invention is to form an integrated circuit including a high-resolution-compatible PWM pulse signal generation device that operates highly accurately and stably.

Means for Solving the Problems

In a particular embodiment the present invention includes a following delay ratio adjusting circuit. This delay ratio adjusting circuit is a circuit for adjusting a delay ratio for a basic delay element using a reference clock pulse generated with a ring oscillator composed of a plurality of serially connected basic delay elements. The delay ratio adjusting circuit includes a first delay element array composed of a first number of serially connected basic delay elements, the reference clock pulse being input to a first basic delay element of the first delay element array and being output from a last basic delay element of the first delay element array, a second delay element array composed of a second number of serially connected adjustment delay elements, the reference clock pulse being input to a first adjustment delay element of the second delay element array and being output from a last adjustment delay element of the second delay element array, and a PLL control circuit for matching a phase of an output pulse of the first delay element array and a phase of an output pulse of the second delay element array so that a constant delay ratio R of an amount of delay of the adjustment delay element to an amount of delay of the basic delay element is obtained, the PLL control circuit including a phase comparator having two input terminals, an output pulse of the first delay element array being input to one of the input terminals and an output pulse of the second delay element array being input to the other input terminal, the PLL control circuit generating a control voltage in accordance with a phase difference detected by the phase comparator and applying the control voltage to each of the adjustment delay elements.

Preferably, in the delay ratio adjusting circuit, another control voltage that another PLL control circuit connected to the ring oscillator generates may be applied to each of the basic delay elements.

Furthermore, preferably, the PLL control circuit may include the phase comparator, a low-pass filter, and a voltage control circuit. The phase comparator may detect a phase difference between an output pulse of the first delay element array and an output pulse of the second delay element array. The voltage control circuit may generate the control voltage on the basis of the phase difference through the low-pass filter.

Additionally, preferably, the other PLL control circuit may perform loop control and lock a phase of an output pulse of the ring oscillator to a phase of an external clock pulse of an external oscillation circuit to generate the reference clock pulse, and may generate the other control voltage on the basis of a phase difference between the reference clock pulse and the external clock pulse.

In addition, preferably, in the delay ratio adjusting circuit, the delay ratio R may be determined by a value (m/n) obtained by dividing the first number m by the second number n. Furthermore, the first number m may be greater than the second number n, and may be equal to one of values between (n+1) and (2n−1), where n is an integer not smaller than 2.

In another embodiment, the present invention includes a following delayed pulse generation circuit. The delayed pulse generation circuit is a circuit for generating a delayed pulse using a reference clock pulse generated by locking a phase of an output pulse of a ring oscillator, composed of a plurality of serially connected basic delay elements, to a phase of an external clock pulse of an external oscillation circuit. The delayed pulse generation circuit includes at least one delay ratio adjusting circuit and at least one delay circuit. The delay ratio adjusting circuit includes a first delay element array composed of a first number of serially connected basic delay elements, the reference clock pulse being input to a first basic delay element of the first delay element array and being output from a last basic delay element of the first delay element array, a second delay element array composed of a second number of serially connected adjustment delay elements, the reference clock pulse being input to a first adjustment delay element of the second delay element array and being output from a last adjustment delay element of the second delay element array, and a PLL control circuit for matching a phase of an output pulse of the first delay element array and a phase of an output pulse of the second delay element array so that a constant delay ratio R of an amount of delay of the adjustment delay element to an amount of delay of the basic delay element is obtained, the PLL control circuit including a phase comparator having two input terminals, an output pulse of the first delay element array being input to one of the input terminals and an output pulse of the second delay element array being input to the other input terminal, the PLL control circuit generating a control voltage in accordance with a phase difference detected by the phase comparator and applying the control voltage to each of the adjustment delay elements. Furthermore, the delay circuit includes a delay element having a characteristic that is the same as a characteristic of the adjustment delay elements and to which the reference clock pulse is input and the control voltage is applied, and a plurality of delay elements having a characteristic that is the same as a characteristic of the basic delay elements and serially connected to the delay element. An amount of delay of an output pulse from each of the delay elements of the delay circuit being determined by the delay ratio R, and is not an integral multiple of an amount of delay of the basic delay element.

In another embodiment, the present invention includes a following pulse signal generation device for performing pulse width modulation (PWM). This pulse signal generation device includes a) a first PLL control circuit to which an external clock pulse is input from an external oscillation circuit and for generating a first control voltage, b) a ring oscillator composed of a plurality of serially connected basic delay elements, the first control voltage being applied to each of the basic delay elements, the ring oscillator performing loop control and locking a phase of an output pulse of the ring oscillator to a phase of the external clock pulse using the first PLL control circuit to generate a reference clock pulse, c) at least one delay ratio adjusting circuit for adjusting a delay ratio for the basic delay element using the reference clock pulse, the delay ratio adjusting circuit including a first delay element array composed of a first number of serially connected basic delay elements, the reference clock pulse being input to a first basic delay element of the first delay element array and being output from a last basic delay element of the first delay element array, a second delay element array composed of a second number of serially connected adjustment delay elements, the reference clock pulse being input to a first adjustment delay element of the second delay element array and being output from a last adjustment delay element of the second delay element array, and a second PLL control circuit for matching a phase of an output pulse of the first delay element array and a phase of an output pulse of the second delay element array so that a constant delay ratio R of an amount of delay of the adjustment delay element to an amount of delay of the basic delay element is obtained, the second PLL control circuit including a phase comparator having two input terminals, an output pulse of the first delay element array being input to one of the input terminals and an output pulse of the second delay element array being input to the other input terminal, the second PLL control circuit generating a second control voltage in accordance with a phase difference detected by the phase comparator and applying the second control voltage to each of the adjustment delay elements, and d) at least one delay circuit including a delay element having a characteristic that is the same as a characteristic of the adjustment delay elements and to which the reference clock pulse is input and the second control voltage is applied, and a plurality of delay elements having a characteristic that is the same as a characteristic of the basic delay elements and to which the first control voltage is applied and serially connected to the delay element, an amount of delay of an output pulse from each of the delay elements of the delay circuit being determined by the delay ratio R, and not being an integral multiple of the amount of delay of the basic delay elements. The pulse signal generation device performs pulse width modulation (PWM) using the output pulse of each of the delay elements of the ring oscillator and the output pulse of each of the delay elements of the at least one delay circuit.

Preferably, in the pulse signal generation device, the adjustment delay elements having (n−1) different delay ratios, $(n+1)/n, (n+2)/n, \ldots$, and $(2n−1)/n$, may be created by means of the delay ratio adjusting circuit using the second delay element array in which the second number n (where n is an integer not smaller than 2) of the adjustment delay elements are serially connected and the first delay element array in which the first number m, equal to one of values between $(n+1)$ and $(2n−1)$, of the basic delay elements are serially connected in combination. The pulse signal generation device may include the (n−1) delay circuits in which a delay element having a characteristic that is the same as a characteristic of each of the adjustment delay elements is used as a first delay element of each of the delay circuits.

In addition, preferably, the pulse signal generation device may further include a selector circuit for selecting an output pulse from each of the delay elements of the ring oscillator and an output pulse from each of the delay elements of the at least one delay circuit.

Furthermore, preferably, the pulse signal generation device may further include a pulse waveform shaping circuit for generating pulses having various pulse widths from the output pulses selected by the selector circuit.

In another embodiment the present invention includes an integrated circuit having a delay ratio adjusting circuit that is characterized in that a first delay element array, a second delay element array, and a PLL control circuit are arranged adjacently.

In another embodiment the present invention includes an integrated circuit having a pulse width modulation (PWM) pulse signal generation device that is characterized in that a first PLL control circuit, a ring oscillator, at least one delay ratio adjusting circuit, and at least one delay circuit are arranged adjacently.

Generally, in pulse width modulation methods, a base clock frequency, namely, a clock rate, is increased to increase resolution for image processing, i.e., to maximize kinds of various pulse widths. In this method, an operating limit of the clock itself becomes a restriction. In a particular embodiment the present invention provides a method for realizing a pulse width modulation pulse signal generation device capable of achieving high resolution for image processing without exceeding the operating limit of the clock itself or the circuit device, i.e., without increasing the base clock frequency.

In an embodiment the present invention employs a stabilized reference clock pulse. This reference clock pulse is generated by detecting a phase difference between a clock pulse from an external oscillation circuit including a crystal oscillator and an output pulse of a ring oscillator that functions as a voltage controlled oscillator (VCO), and adjusting current that flows through delay elements of the ring oscillator to change a frequency and a phase of the ring oscillator and to lock the phase of the ring oscillator to a phase of the clock pulse from the crystal oscillator of the external oscillation circuit. That is, the stabilized reference clock pulse is generated using a PLL (phase locked loop). Furthermore, by means of a method for synchronizing two or more kinds of delay circuit at an identical frequency, phases are shifted with respect to the reference clock pulse in each delay circuit to generate delayed output pulses. By superimposing these output pulses, the pulse width modulation is performed. For example, n delay circuits synchronized at an identical frequency are formed, and phases are shifted from one another by 360/2n degrees, and these output pulses are superimposed, thereby realizing the pulse width modulation.

Generally, a PLL adjusts a phase so that the phase is shifted by 0 degrees with respect to a base clock (e.g., an external clock pulse from an external oscillation circuit) by detecting a phase difference. However, the PLL requires a state in which a phase of a signal having the same frequency as the base clock is shifted by 90 degrees. Generally, it is possible to shift the phase by 90 degrees by counting a clock having a quadruple clock frequency. However, realization of this is difficult at a level exceeding a limit rate of a semiconductor device. In addition, although a phase comparator with 90-degree phase difference can be formed by performing phase comparison using a multiplier, creating a high-speed multiplier is significantly difficult, and the clock rate may be drop to about one-tenth. On the other hand, the present invention employs a method for comparing delay times of two delay element arrays and locking the phase using a PLL to match the phases of the output pulses of delay element arrays. Resolution of images depends on the number of selectable pulse widths. For example, the number of delay steps of an output pulse is doubled and a logical operation is performed, whereby corresponding resolution can be doubled.

A delayed pulse generation circuit according to an embodiment of the present invention includes a delay ratio adjusting circuit and a delay circuit. The delay ratio adjusting circuit is for forming an adjustment delay element having a delay time (in the description given below, also referred to as an amount of delay) that is different from a basic delay time of a basic delay element and is not an integral multiple of the basic delay time. The delay circuit is constituted by setting an adjustment delay element (delay elements arranged separately and having a characteristic that is the same as that of the adjustment delay elements of the delay ratio adjusting circuit are also referred to as adjustment delay elements, and the same expression is used in the following figures) as a first delay element and by connecting a plurality of basic delay elements (basic delay elements arranged separately and having a characteristic that is the same as that of basic delay elements of a ring oscillator are also referred to as basic delay elements, and the same expression is used in the following figures) to the adjustment delay element. The delayed pulse generation circuit can generate output pulses having a phase difference with respect to output pulses from each of the delay elements of a ring oscillator 220 of FIG. 2, according to a known art, composed of only basic delay elements.

Figure 2A:
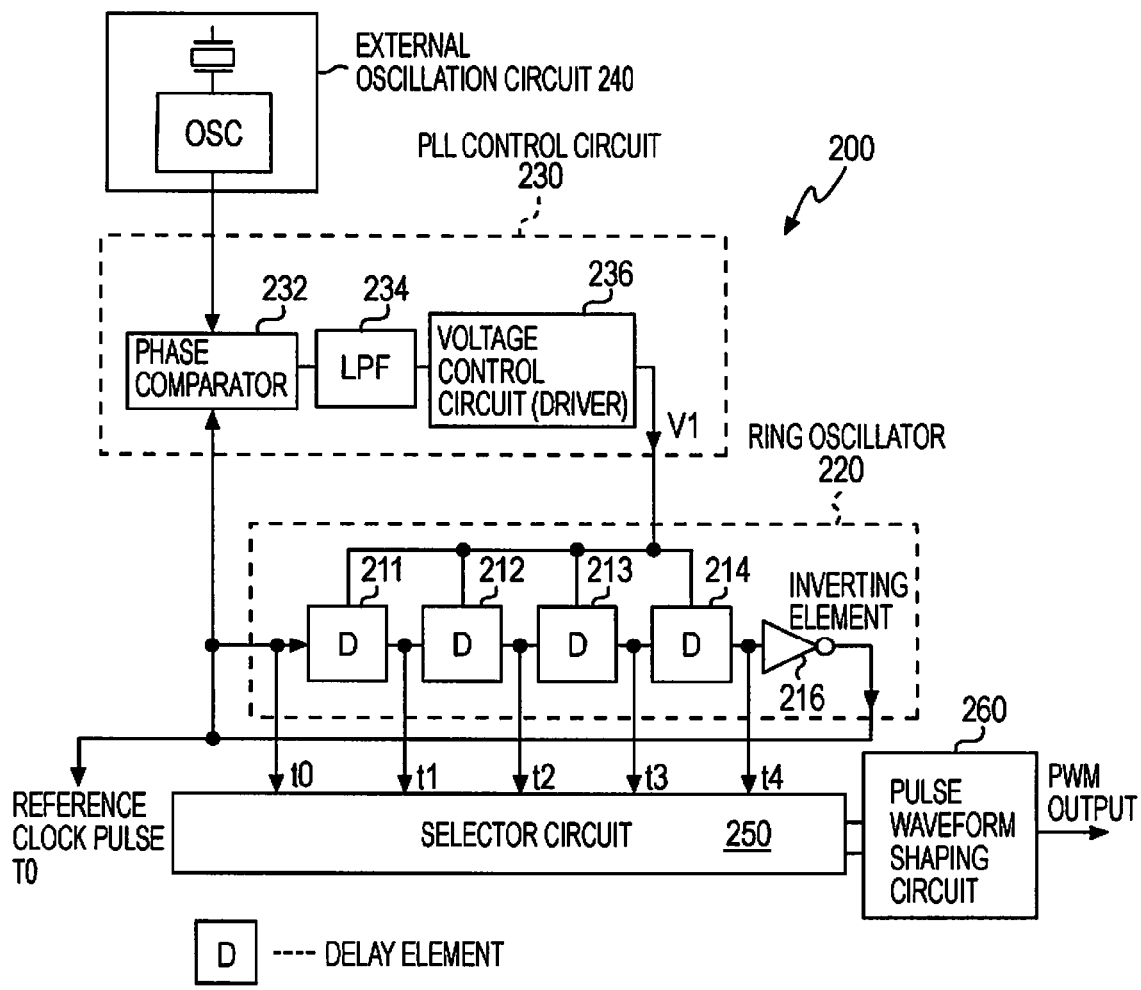
FIG. 2 is a diagram of a pulse width modulation (PWM) pulse signal generation device employing a ring oscillator, (a) Is a diagram showing an entire configuration and (b) is a diagram showing output waveforms.
Figure 3A:
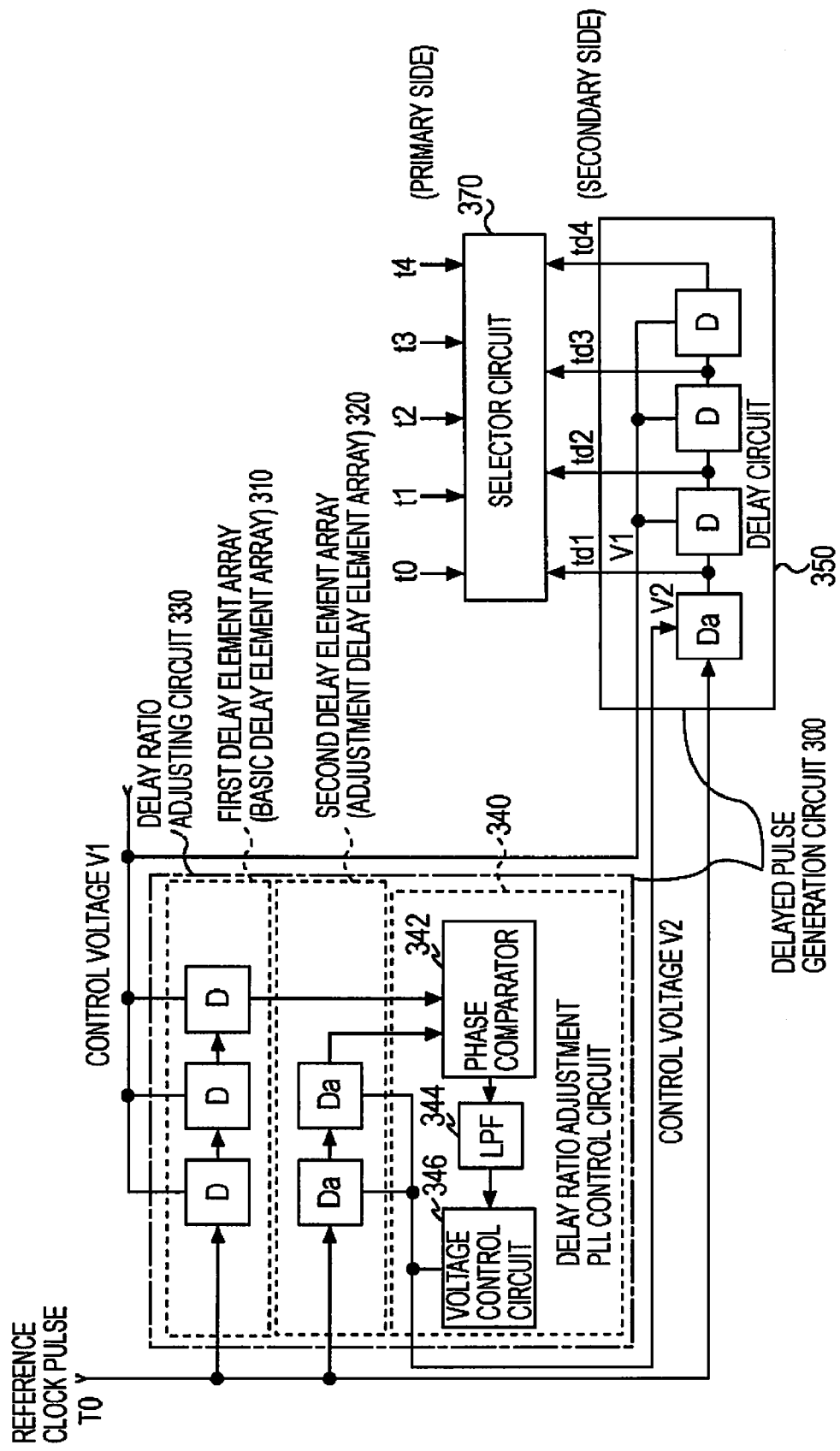
FIG. 3 is a diagram showing a delayed pulse generation circuit according to an embodiment of the present invention, (a) is a diagram showing an entire configuration and (b) is a diagram showing output waveforms.

A delayed pulse generation circuit 300 according to an embodiment of the present invention is shown in FIG. 3(a). The delayed pulse generation circuit 300 is constituted by a delay ratio adjusting circuit 330 and a delay circuit 350. For example, the delayed pulse generation circuit uses a stabilized reference clock pulse T0 that is generated by locking a phase of an output signal of a ring oscillator 220 to an external clock pulse of an external oscillation circuit 240 using a circuit, according to a known art, shown in FIG. 2(a), i.e., using the ring oscillator 220 having a plurality of serially connected basic delay elements (D) and a PLL control circuit 230 (in the following description, referred to as a first PLL control circuit). The reference clock pulse T0 is input to first delay elements of delay element arrays. The PLL control circuit 230 shown in FIG. 2(a) generates a control voltage V1. This control voltage V1 is applied to each of delay elements (D) 211 to 214 of the ring oscillator 220 in FIG. 2(a) and to each of basic delay elements (D) in FIG. 3(a). Although the delay circuit may be configured as an open delay circuit as shown in, for example, FIG. 3(a), the configuration is not limited to this circuit configuration. The delay ratio adjusting circuit 330 is constituted by two delay element arrays 310 and 320 and a delay ratio adjustment PLL control circuit (in the following description, referred to as a second PLL control circuit) 340. The second PLL control circuit 340 is constituted by a phase comparator 342, a low-pass filter (e.g., an integrator) 344, and a voltage control circuit 346. In the first delay element array (a basic delay element array) 310, three basic delay elements D, to which the control voltage V1 that the first PLL control circuit 230 generates is applied, are serially connected. In the second delay element array (an adjustment delay element array) 320, two adjustment delay elements Da, to which the control voltage V2 that the second PLL control circuit 340 generates is applied, are serially connected. The reference clock pulses T0 having an identical frequency are input to a first delay element, i.e., a first stage delay element, of each of the delay element arrays. The phase comparator 342 of the second PLL control circuit 340 detects a phase difference between outputs from each of the delay element arrays (310, 320). The corresponding control voltage V2 is generated by the voltage control circuit 346 through the low-pass filter 344. This control voltage V2 is applied to each of the adjustment delay elements Da. Here, the basic delay elements D and the adjustment delay elements Da can be formed by identical delay elements, i.e., identical circuit configurations of the same size. However, it should be noted that the configuration is not limited to the formation by the identical delay elements.

Figure 2B:
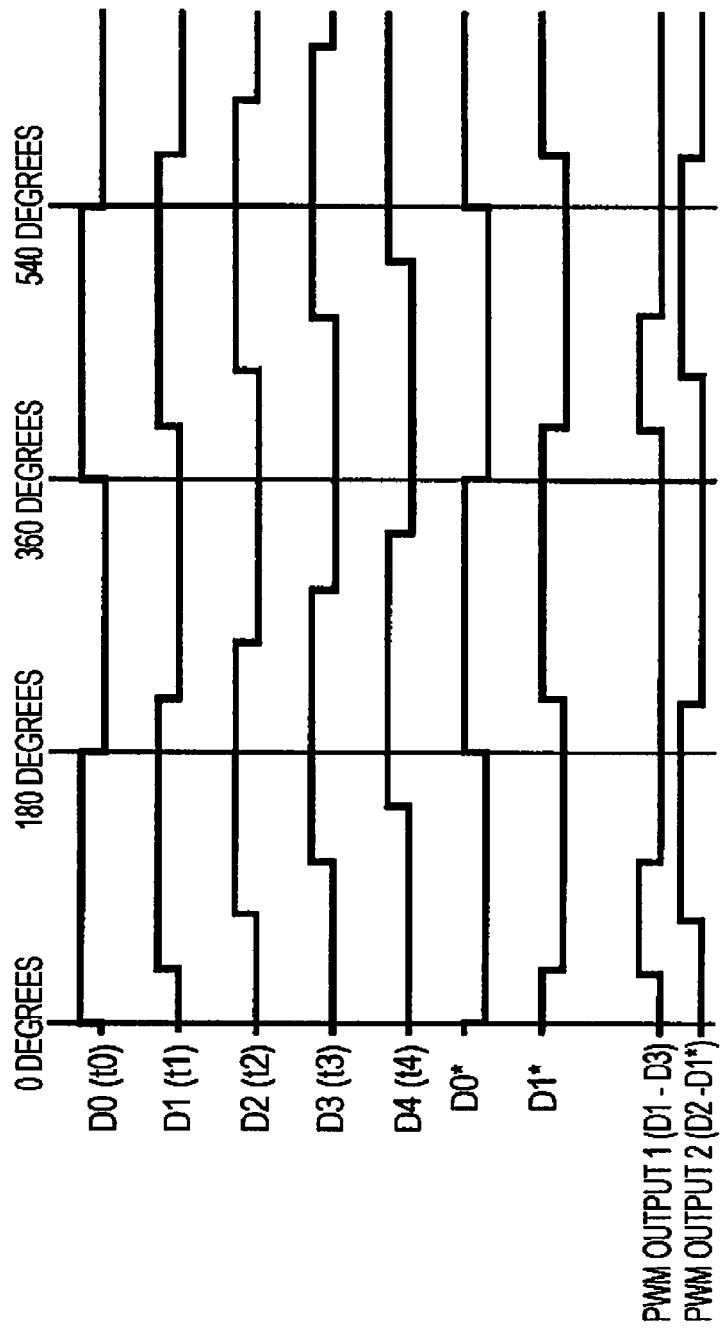

It is possible to make delay element characteristics uniform or aligned by forming the delay elements (D) of the first delay element array at a position near the delay elements (D) 211 to 214 of the ring oscillator 220 of FIG. 2(a) in an integrated circuit (LSI). Thus, the amount of delay of one delay element of the first delay element array can be matched with an amount of delay of one of the delay elements 211 to 214 of the ring oscillator of FIG. 2(a). As shown in FIG. 3(a), using the second (delay ratio adjustment) PLL control circuit 340, loop control is performed and locked so that a phase of the output pulse from the two (two-stage) delay elements (Da) of the second delay element array 320 and a phase of an output pulse from three (three-stage) delay elements (D) (preferably, having the amount of delay of the delay element of the ring oscillator of FIG. 2(a)) of the first delay element array 310 are matched. Accordingly, the amount of delay of the adjustment delay element (Da) can be adjusted so that the delay time caused by three delay elements of the first delay element array 310 and the delay time caused by two delay elements of the second delay element array 320 become equal. More specifically, in the delay ratio adjusting circuit 330, the delay for two adjustment delay elements Da is equalized to the delay for three basic delay elements D by locking the phases of the output pulses of the delay element arrays using the second PLL control circuit 340. Thus, one adjustment delay element Da has the amount of delay half as much again as the amount of delay of one basic delay element D.

Figure 9:
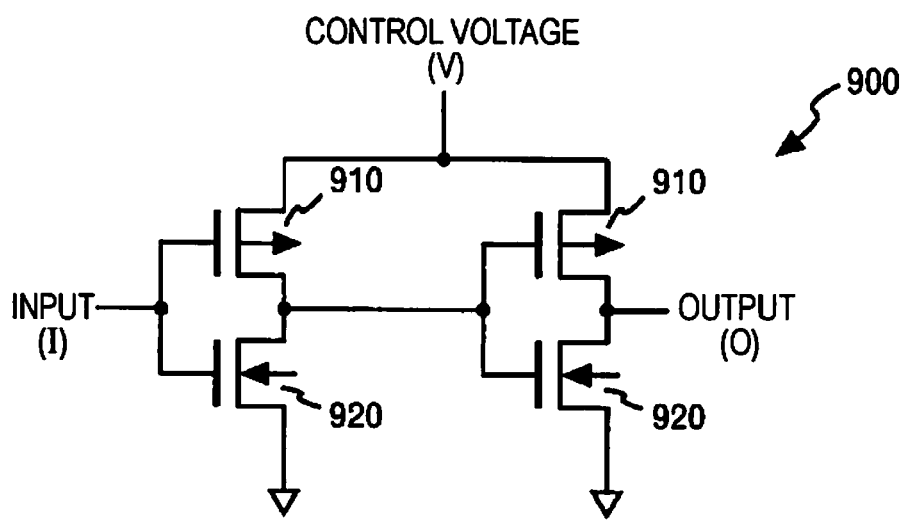
FIG. 9 is a diagram showing an embodiment of a delay element.

An embodiment of a delay element used in the present invention is shown in FIG. 9. An element in which two inverters each constituted by a CMOS transistor can be used as a delay element 900. FIG. 9 shows an example of a circuit of the delay element 900 in which a p-channel MOS transistor 910 and an n-channel MOS transistor 920 constitute an inverter and two such inverters are connected. A control voltage V is supplied to the p-channel transistors. The delay time from an input (I) to an output (O) can be controlled by an input of the control voltage V. The circuit configuration of the delay element is not limited to the circuit shown in FIG. 9, and various circuit configurations are possible.

As shown in FIG. 3(a), the delay circuit 350 may be an open delay circuit in which one delay element (referred to as an adjustment delay element Da) having a characteristic that is the same as the adjustment delay elements Da is used as a first stage (a first delay element) and a plurality of delay elements (referred to as basic delay elements D) having a characteristic that is the same as the basic delay elements D are serially connected to the adjustment delay element Da. Delay elements having the same characteristic are called by the same name, i.e., the basic delay elements or the adjustment delay elements. The control voltage V2 that the second PLL control circuit 340 generates is applied to the first stage adjustment delay element Da. The control voltage V1 is applied to each of the basic delay elements D. The reference clock pulse T0 is input to the first adjustment delay element Da. Outputs of the delayed pulse generation circuit 300 are a group of output pulses td1 to td4 of the delay elements of the delay circuit 350. In FIG. 3(a), the output pulses of the delay circuit are denoted as a secondary side, and a group of output pulses t0, t1 to t4 generated by, for example, a circuit of FIG. 2(a) according to the known art is denoted as a primary side to distinguish from one another. An example of the output pulse from each of the delay elements of the delay circuit 350 is shown in FIG. 3(b). As shown in FIG. 3(b), phases of the group of output pulses td1 to td4 (waveforms denoted by dotted lines, the secondary side) from the delay elements are shifted by 90 degrees with respect to those of the group of output pulses t1 to t4 (waveforms denoted by solid lines, the primary side) from the delay elements of the delay circuit in which only four basic delay elements are serially connected. This is because, in the delay ratio adjusting circuit 330, the amount of the delay is adjusted so that one adjustment delay element Da has the amount of delay half as much again as the mount of delay of one basic delay element D. This is possible since one cycle of a clock (360-degree phase) is obtained with two basic delay elements (D) and a 90-degree phase difference is caused between one adjustment delay element (Da) and two basic delay elements (D). More specifically, if a minimum delay amount of each of the delay elements (211 to 214) of a delay circuit (e.g., the ring oscillator 220 of FIG. 2(a)) constituted by only serially connected basic delay elements is 1, the delay step is the delay ½ (a half) as much as the minimum delay amount. As described below, these two groups of output pulses t0 to t4 (the primary side) and td1 to td4 (the secondary side) are superimposed and selected by a selector circuit 370, whereby a delay step of a delay amount that the phase is shifted by ½ with respect to the minimum delay amount of one basic delay element is generated. In the present invention, the delay circuit 350 is not limited to the open delay circuit as shown in FIG. 3(a). Furthermore, the number of the delay elements of the delay element array of the delay circuit can be constituted by several hundreds of delay elements generally. However, it should be noted that the number of the delay elements in the delay element array is not limited.

The delay ratio adjusting circuit 330 has the second PLL control circuit 340 for adjusting the delay ratio. The delay ratio adjusting circuit 330 is configured so that an output of the basic (first) delay element array 310, in which a first number of basic delay elements (D) are serially connected, and an output of the adjustment (second) delay element array 320, in which a second number of adjustment delay elements (Da) are serially connected, are locked by the PLL control circuit 340 and the delay amount of the adjustment delay element (Da) has a constant delay ratio R with respect to the delay amount of the basic delay element (D). The delay ratio R is determined by a value (the first number/the second number) obtained by dividing the first number m by the second number n. Preferably, the first number m may be greater than the second number n, and equal to one of values between (n+1) and (2n−1), where n is an integer not smaller than 2.

In addition, in the delay circuit 350, the adjustment delay element (Da) arranged as the first stage delay element is serially connected by the basic delay elements (D). The reference clock pulse T0 is input to the basic delay element array 310, the adjustment delay element array 320, and the first stage delay element (Da) of the delay circuit 350. The first control voltage V1 generated in the first PLL control circuit (230 in FIG. 2(a)) is applied to each of the basic delay elements D. The second control voltage V2 generated in the second PLL control circuit 340 is applied to each of the adjustment delay elements Da. When the delay amount (the delay time) of the basic delay element D is 1, the output pulse from each delay element of the delay circuit 350 is delayed by the delay step of the delay amount (R−1) obtained by subtracting 1 from the delay ratio R. One delayed pulse generation circuit 300 is constituted by a combination of a delay ratio adjusting circuit 330 and a delay circuit 350.

In the delay ratio adjusting circuit 330 of FIG. 3(a), the reference clock pulse T0 may be a stabilized pulse whose phase is locked to a phase of an external clock pulse from the external oscillation circuit 240 by the first PLL control circuit 230 using the ring oscillator 220, in which the plurality of basic delay elements are serially connected, preferably as shown in FIG. 2(a). Furthermore, the control voltage V1 that the first PLL control circuit 230 generates is applied to the basic delay elements (D) of the ring oscillator 220 of FIG. 2(a) as well as the each basic delay elements D of the first delay element array 310.

Figure 4:
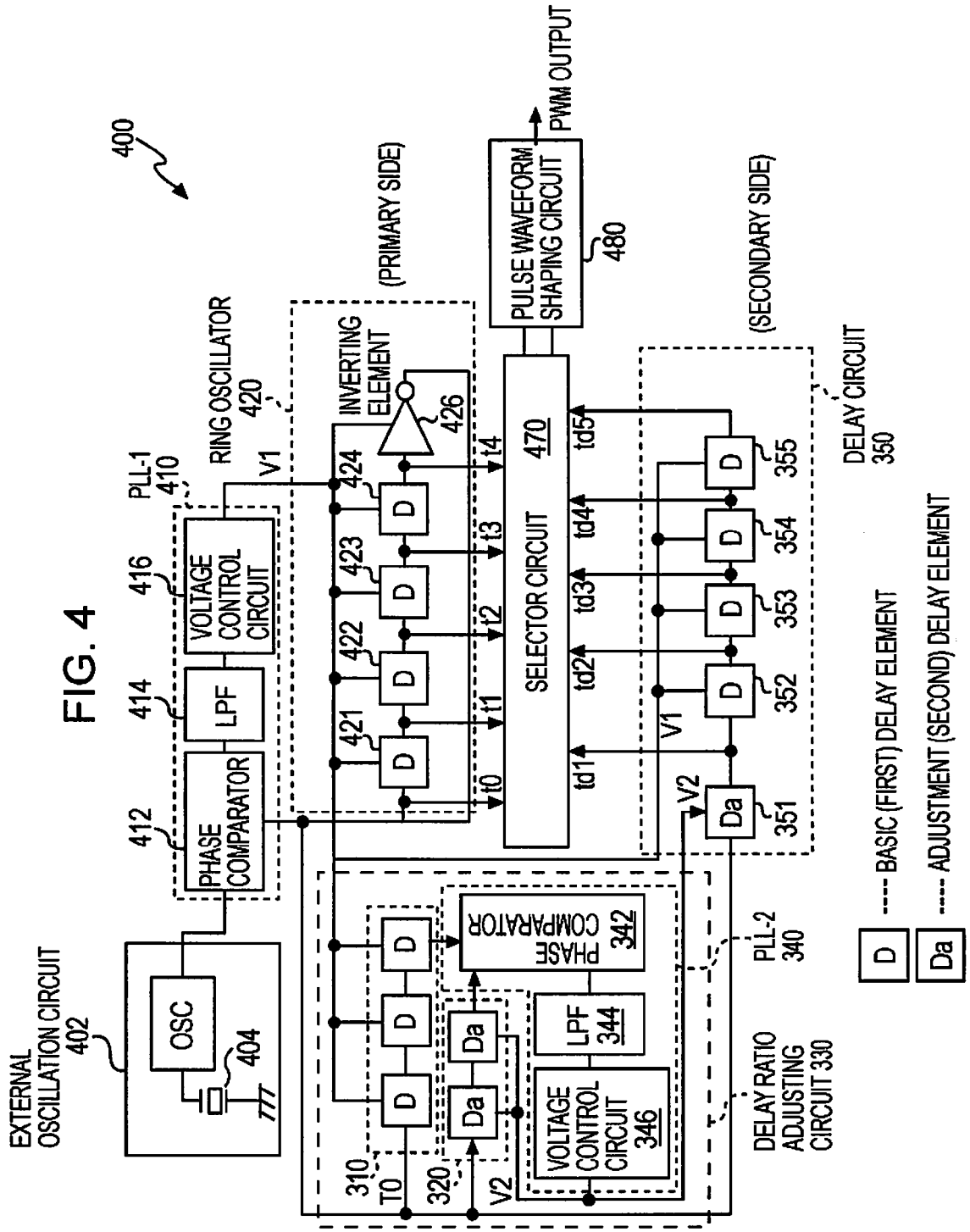
FIG. 4 is a diagram showing a high-resolution compatible pulse width modulation (PWM) pulse signal generation device according to an embodiment of the present invention.

Next, a block diagram of an embodiment of a pulse width modulation (PWM) pulse signal generation device 400 capable of increasing resolution without changing a basic frequency of an external oscillation circuit is shown in FIG. 4. This pulse signal generation device 400 includes the delayed pulse generation circuit 300 of FIG. 3(a). More specifically, as shown in FIG. 4, the pulse signal generation device 400 includes 1) a first PLL control circuit (PLL-1) 410, 2) a ring oscillator 420, 3) a delay ratio adjusting circuit 330, and 4) a delay circuit 350. The first PLL control circuit 410 is supplied with an external clock pulse from an external oscillation circuit 402 including a crystal oscillator 404 and is constituted by a phase comparator 412, a low-pass filter (e.g., integrator) 414, and a voltage control circuit 416. The ring oscillator 420 is connected to the first PLL control circuit 410 and in which a plurality of basic delay elements (first delay elements) D are serially connected. The delay ratio adjusting circuit 330 includes a second PLL control circuit (PLL-2) 340, a first delay element array 310, and a second delay element array 320. The second PLL control circuit 340 is constituted by a phase comparator 342, a low-pass filter 344, and a voltage control circuit 346. In the first delay element array 310, three basic delay elements (first delay elements) D are serially connected. In the second delay element array 320, two adjustment delay elements (second delay elements) Da are serially connected. The delay ratio adjusting circuit 330 is configured so that the adjustment delay element has a delay amount of a constant delay ratio R with respect to the basic delay element (D). The delay circuit 350 is connected to the second PLL control circuit 340 and includes a delay element (denoted as an adjustment delay element Da) having the same characteristic as the adjustment delay elements (Da) at a first stage and a plurality of serially connected delay elements (denoted as basic delay elements D) having the same characteristic as the basic delay elements (D) at second or later stages. In addition, a first control voltage (V1) generated in the first PLL control circuit 410 is applied to each of the basic delay elements. A second control voltage (V2) generated in the second PLL control circuit 340 is applied to each of the adjustment delay elements. A reference clock pulse T0 generated by locking an output signal of the ring oscillator 420 to an external clock pulse of the external oscillation circuit 402 by the first PLL control circuit 410 is input to each of first delay elements of the first delay element array 310 and the second delay element array 320 of the delay ratio adjusting circuit 330, the ring oscillator 420, and the delay circuit 350.

As described above, in the delay circuit 350, one adjustment delay element (Da) configured to have a constant delay ratio R by the delay ratio adjusting circuit 330 and a plurality of basic delay elements (D) are serially connected to the adjustment delay element (Da). By this configuration, clock pulse signals (on a primary side) generated by the delay elements (D) 421 to 424 of the ring oscillator 420 and clock pulse signals (on a secondary side) generated at the delay circuit 350 have a 90-degree phase difference, as described above. It becomes possible to generate a clock pulse compatible with doubled resolution by superimposing these signals. A case where the phase difference is 90 degrees is described here. However, it is possible to generate a clock pulse signal compatible with higher resolution depending on combinations of the number of basic delay elements (D) of the first delay element array 310 of the delay ratio adjusting circuit 330 and the number of adjustment delay elements (Da) of the second delay element array 320, and the number of serially connected basic delay elements (D) constituting a ring oscillator (e.g., the ring oscillator in FIG. 2(*a*)) as described below. In addition, in the delay ratio adjusting circuit 330 of FIG. 4, it is preferable to make the delay amount of the adjustment delay element (Da) of the second delay element array 320 greater than the delay amount of the basic delay element (D) of the first delay element array 310 to assure the operation of the first PLL control circuit 410 at the maximum frequency.

As shown in FIG. 4, in the pulse signal generation device 400 for performing pulse width modulation (PWM), the ring oscillator 420 functions as a voltage controlled oscillator (VCO). Preferably, in the selector circuit 470, the output pulse signals from each of the delay elements D of the ring oscillator 420 and each of the delay elements Da and D of the foregoing delay circuit 350 are selected. Then, PWM pulse signal waveforms having various pulse widths can be generated by the pulse waveform shaping circuit 480 from the output pulses from the delay elements selected by the selector circuit 470.

In the ring oscillator 420, four basic delay elements (D) 421 to 424 are serially connected. A logic inverting element 426 is connected to the last delay element 424. An output of the logic inverting element 426 is fed back to the first delay element 421. This fed-back output pulse and the base clock pulse of the external oscillation circuit 402 are input to two input terminals of the phase comparator 421 of the first PLL control circuit 410 and undergone loop control and locked to generate the stabilized reference clock pulse T0. An adjustment delay element (Da) 351 and basic delay elements (D) 352 to 355 are serially connected at the first and second to fifth stages of the delay circuit 350, respectively.

Figure 5:
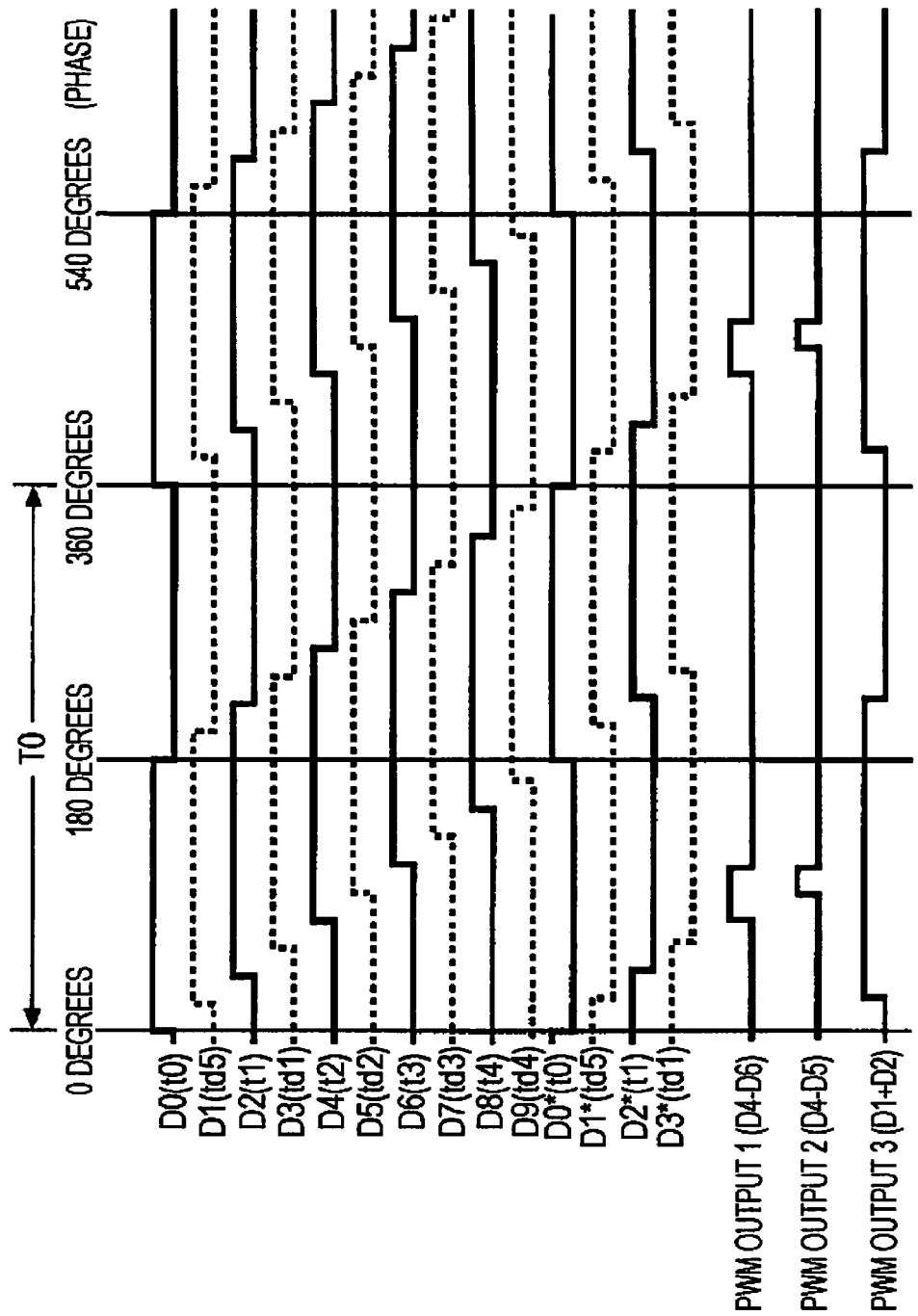
FIG. 5 is a diagram showing an example of output pulses from delay elements of two delay circuits in FIG. 4 and PWM outputs.

FIG. 5 shows an example of PWM output pulse waveforms resulting from superimposing the output pulse waveforms of delay elements of the ring oscillator 420 and the delay circuit 350 and generated by the pulse waveform shaping circuit 480. When the delay amount of the delay element D of the ring oscillator 420 is 1, the delay amount of the delay element of the delay circuit 350 is greater than the delay amount of the delay element of the ring oscillator 420 by 0.5, and the phases thereof are shifted by 90 degrees. Accordingly, as shown in FIG. 5, delayed pulses can be generated with the phases being delayed by a half of the delay amount of the ring oscillator 420. More specifically, as shown in FIG. 5, a pulse at the input stage and the output pulses of the delay elements D of the ring oscillator 420 correspond to waveforms denoted by solid lines, D0 (t0), D2 (t1), D4 (t2), D6 (t3), and D8 (t4). In addition, the output pulses of the delay elements Da and D of the delay circuit 350 correspond to waveforms denoted by dotted lines, D3 (td1), D5 (td2), D7 (td3), D9 (td4), and D1 (td5). That is, the output pulses of the delay elements Da and D of the delay circuit 350 are delayed by ½ (a half) of the delay amount of the output pulses of the delay elements of the ring oscillator. The selector circuit 470 of FIG. 4 selects output pulse signals from each delay element D of the ring oscillator 420 and each of delay elements Da and D of the delay circuit 350. Furthermore, the pulse waveform shaping circuit 480 performs operations of waveform D4−waveform D6 (subtraction), waveform D4−waveform D5 (subtraction), and waveform D1+waveform D2 (addition) on the output pulse waveforms selected by the selector circuit 470, whereby waveforms of PWM outputs 1, 2, and 3 are obtained, respectively. Accordingly, various pulse widths become selectable by performing logical operations in the pulse waveform shaping circuit 480.

Figure 10:
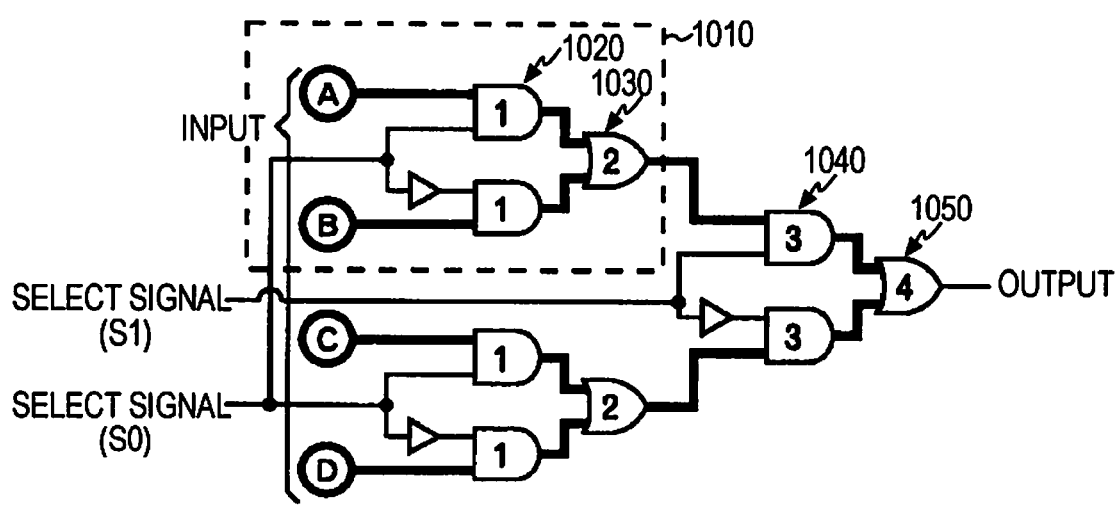
FIG. 10 is a diagram showing an embodiment of a selector circuit.

An example of a schematic configuration of the selector circuit 470 of FIG. 4 is shown in FIG. 10. The selector circuit 470 can be formed by combining basic structures 1010 that are constituted by AND gates and an OR gate. Numerals, 1, 2, 3, 4, written in symbols of AND gates (1020 and 1040) and OR gates (1030 and 1050) represent the stage number. Paths that delayed pulse signals pass are denoted by thick lines. The selector circuit 470 is formed by combining the basic structures 1010 while matching the stage number so that the delay becomes constant. Select signals S0 and S1 are used for selecting the signal to pass and are generally connected to selector control circuits (1210 and 1220 of FIG. 12). Preferably, the selector circuit 470 of FIG. 4 may include a selector circuit 1 (a reference numeral 1120 in FIG. 11) for selecting the signal from each delay element of the ring oscillator 420 in FIG. 4 and a selector circuit 2 (a reference numeral 1130 in FIG. 11) for selecting the signals from the delay elements of the delay circuit 350.

Figure 11:
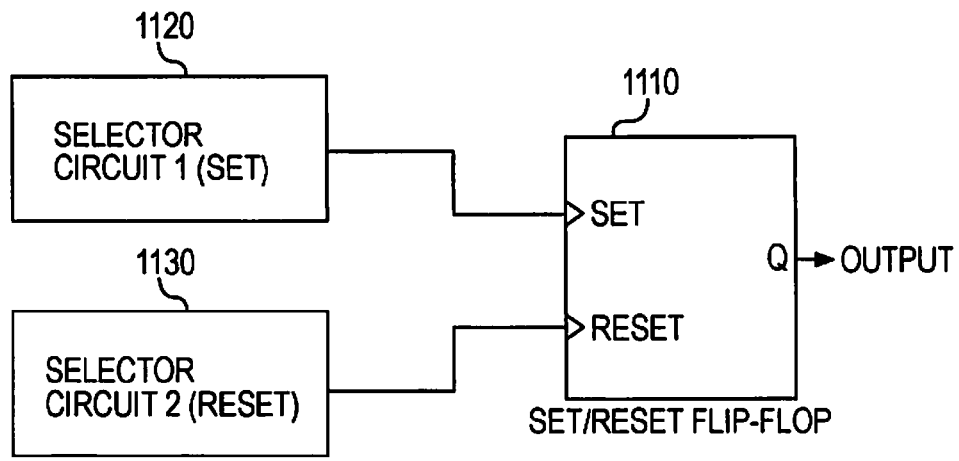
FIG. 11 is a diagram showing an embodiment of a pulse waveform shaping circuit.

An example of a schematic configuration of the pulse waveform shaping circuit 480 of FIG. 4 is shown FIG. 11. The pulse waveform shaping circuit 480 can be constituted by a flip-flop circuit 1110 enabling Set and Reset at the rise of the output pulse waveforms from the selector circuits. For example, the selector circuit 1 1120 for selecting the signal from each delay element of the ring oscillator 420 of FIG. 4 may be connected to SET of the flip-flop circuit, whereas the selector circuit 2 1130 for selecting the signals from delay elements of the delay circuit 350 may be connected to RESET.

Figure 6:
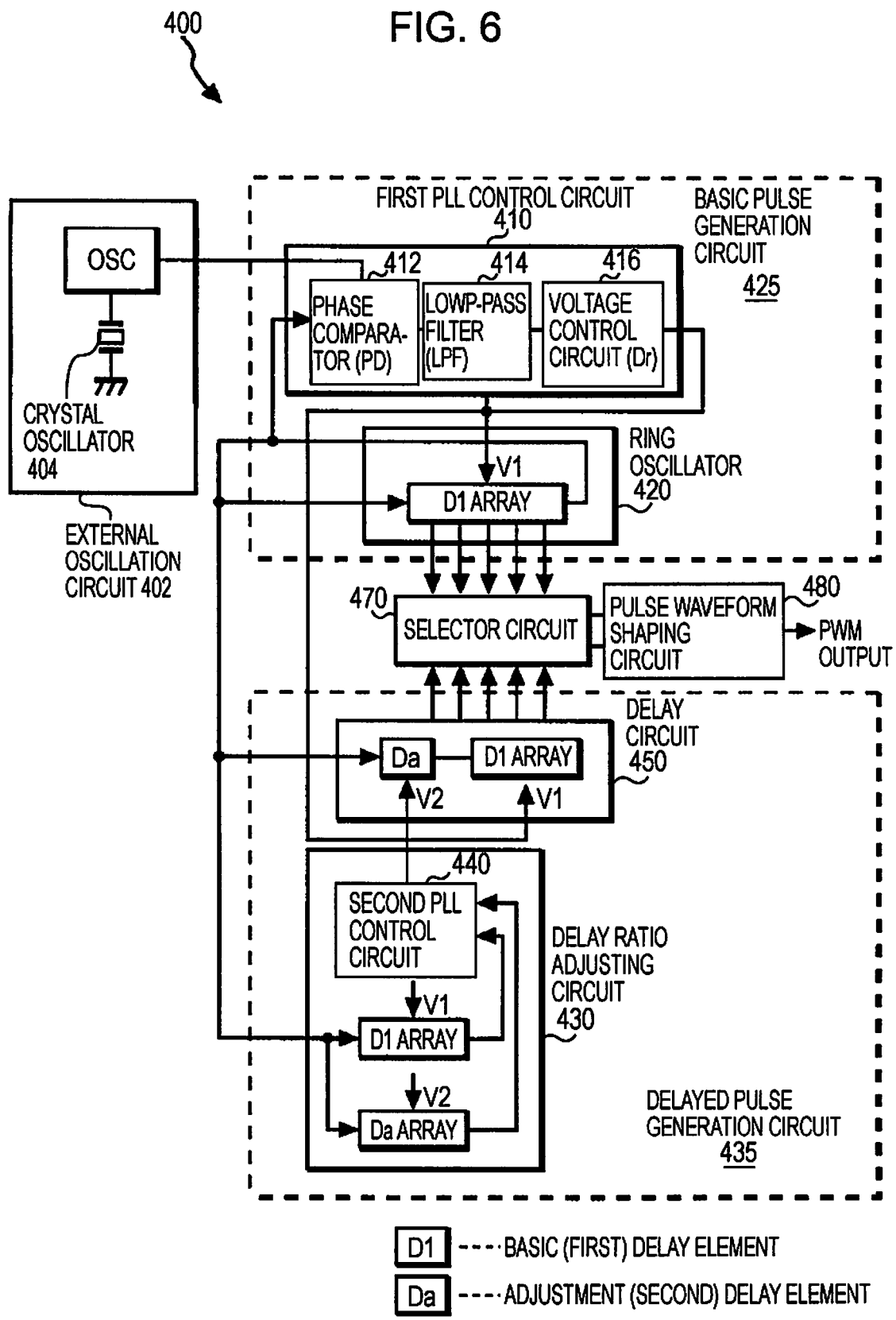
FIG. 6 is a schematic block diagram of a pulse width modulation (PWM) pulse signal generation device according to an embodiment of the present invention.

FIG. 6 shows a schematic block diagram of a pulse width modulation (PWM) pulse signal generation device 400. This pulse signal generation device 400 is generally constituted by a basic pulse generation circuit 425 and a delayed pulse generation circuit 435. In the delayed pulse generation circuit 435, each of output pulses of a basic delay element array (D1 array) and an adjustment delay element array (Da array) is locked by a second PLL control circuit 440. A delay ratio R of the adjustment delay element is generated by a delay ratio adjusting circuit 430. A group of delayed pulses is generated by a delay circuit 450 in which an adjustment delay element (denoted as Da in FIG. 6) having the same characteristic as the adjustment delay elements Da is inserted at a first stage of the D1 array. Pulse waveforms (e.g., waveforms denoted by solid lines and dotted lines in FIG. 5) having a delay amount step smaller than the minimum delay mount of the basic delay element are generated by superimposing this group of delayed pulses and a group of pulses generated by the basic pulse generation circuit 425. Additionally, preferably, the delay amount of the adjustment delay element Da is set to a delay amount greater than a delay amount for one basic delay element (D) generated in the ring oscillator 420. That is, preferably, the delay ratio R may be set to a value greater than 1 to allow a high-speed operation at an upper limit of an oscillation frequency of the ring oscillator 420 that is locked to the basic frequency supplied from the external oscillation circuit.

Referring to the block diagram of FIG. 6, it should be understood that a PWM pulse signal generation device compatible with handling higher resolution images can be realized by forming a plurality of delayed pulse generation circuits using adjustment delay elements Da having different delay ratios R and connecting the plurality of delayed pulse generation circuits to the selector circuit 470.

Figure 7:
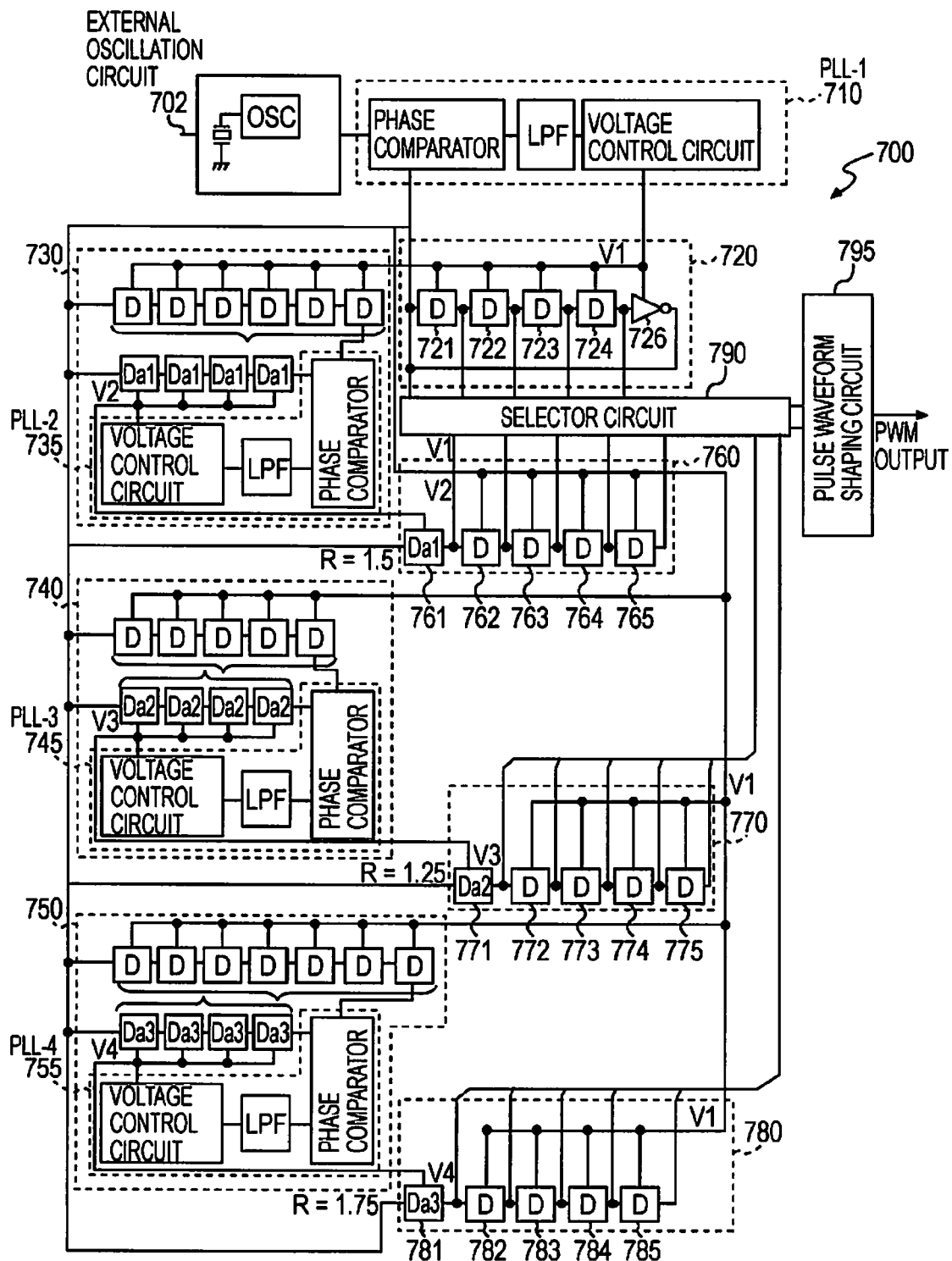
FIG. 7 is a diagram showing an entire configuration of a high-resolution compatible pulse width modulation (PWM) pulse signal generation device according to another embodiment of the present invention.

A PWM pulse signal generation device 700 capable of achieving quadruple resolution by expanding the configuration of FIG. 6 is shown in FIG. 7. The combination of the number of each type of serially connected delay elements in two delay element arrays is changed. More specifically, the number of basic delay elements D and the number of adjustment delay elements Da1, Da2, and Da3 are selected appropriately. In FIG. 7, delay ratios R of a delay amount of adjustment delay element Da1, Da2, or Da3 to a delay amount of the basic delay element D can be altered by locking the output pulses of two delay element arrays by each of delay ratio adjustment PLL control circuits 735 (PLL-2), 745 (PLL-3), and 755 (PLL-4). As shown in FIG. 7, in each of delay ratio adjusting circuits 730, 740, and 750, first delay element arrays (D arrays) having six, five, and seven (corresponding to a first number) basic delay elements D and a second delay element arrays (Da1 array, Da2 array, and Da3 array) having four (corresponding to a second number) adjustment delay elements Da1, Da2, and Da3 are formed, respectively. The delay amount of each adjustment delay element Da1, Da2, or Da3 is set to a value equal to 6/4, 5/4, or 7/4 (corresponding to the first number/the second number) of the delay amount of the basic delay element D by locking the output pulses from the first delay element arrays (the D arrays) and the output pulses from the second delay element arrays (the Da1 array, the Da2 array, and the Da3 array) by each of the PLL control circuits (PLL-2, PLL-3, and PLL-4) 735, 745, and 755, respectively. That is, the delay ratio R=1.5 (which is consequently the same as 3/2 resulting from three basic delay elements/two adjustment delay elements in FIG. 3(*a*)), R=1.25, or R=1.75 can be obtained. Each of delay circuits 760, 770, 780 is constituted by setting an adjustment delay element (Da1, Da2, or Da3) having the same characteristic as these adjustment delay elements Da1, Da2, and Da2 as a first (first stage) delay element and by connecting a plurality of (four in FIG. 7) basic delay elements to the adjustment delay element, respectively. By means of each of the delay circuit 760, 770, and 780, delayed pulses whose phases are shifted by 0.5, 0.25, and 0.75 (corresponding to R−1) can be generated when the delay amount of the basic delay elements is 1. In other words, four groups of delayed pulses whose minimum delay steps are 1, 0.5, 0.25, and 0.75 can be generated. Three groups of output pulses from each delay element of these delay circuits 760, 770, and 780 and a group of output pulses from each delay element of a ring oscillator 720 constituted by only basic delay elements D, i.e., four groups of output pulses, are input to a selector circuit 790. By performing pulse width modulation through a pulse waveform shaping circuit 795, a pulse output capable of achieving quadruple resolution, in comparison with, for example, the simple circuit using a ring oscillator shown in FIG. 2(*a*), can be obtained.

Figure 8A:
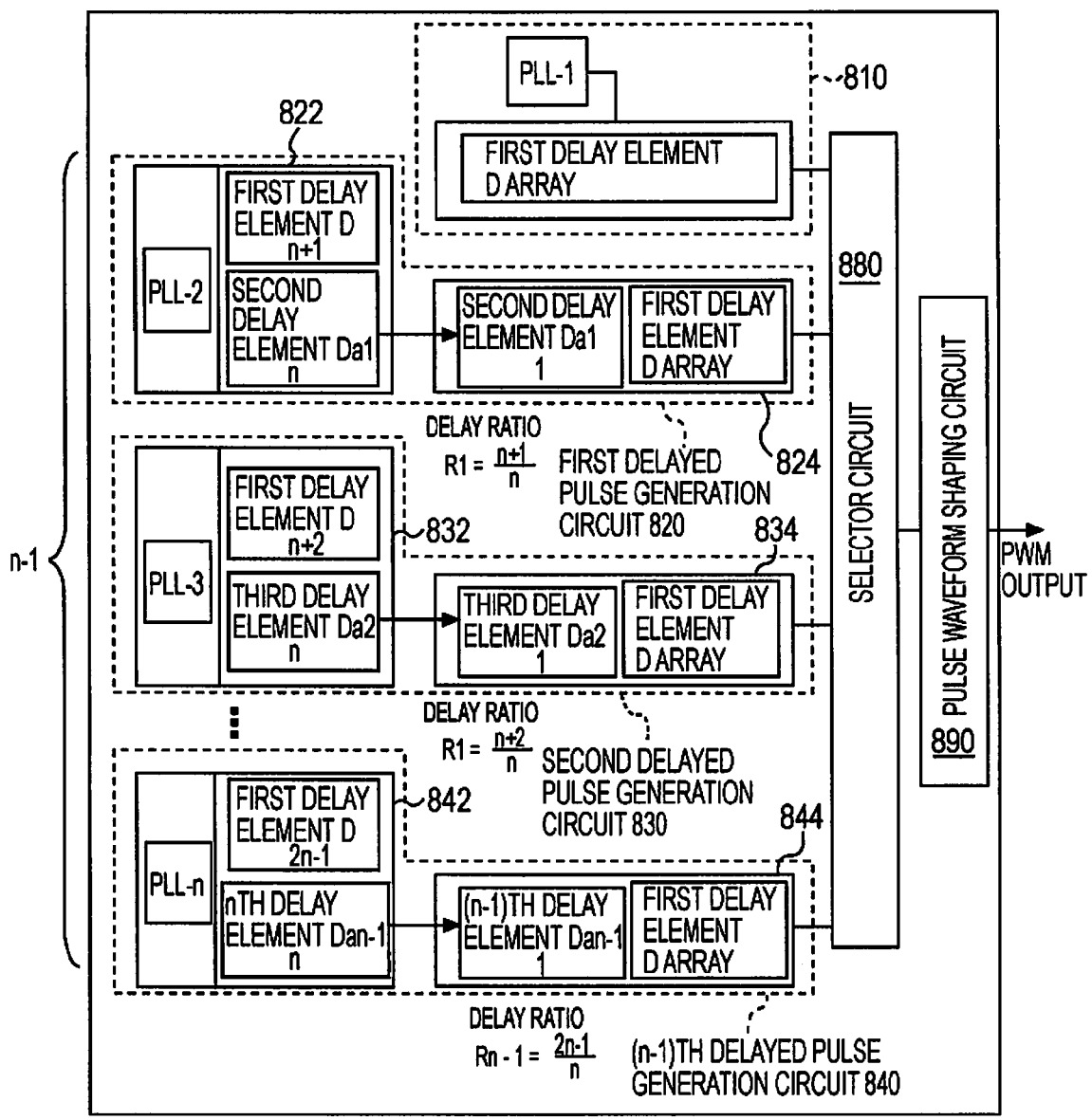
FIG. 8 is a diagram showing a high-resolution compatible pulse width modulation (PWM) pulse signal generation device according to still another embodiment of the present invention, (a) shows a conceptual diagram, and (b) shows a specific example for an increase in resolution.

Furthermore, as shown in FIG. 8(*a*), a PWM pulse signal generation device can cope with an increase in resolution by more than four times by combining a plurality of delayed pulse generation circuits 820, 830, and 840 and a basic pulse generation circuit 810. Delayed pulse generation circuits 820, 830, and 840 are constituted by delay ratio adjusting circuits 822, 832, and 842 and delay circuits 824, 834, and 844, respectively. Suppose that the number of adjustment delay elements (a second number) in an adjustment delay element array (a second delay element Da1, a third delay element Da2, or an nth delay element Dan-1 in FIG. 8(*a*)) is n. The number of basic delay elements (a first number) in a basic delay element array (a first delay element D array in FIG. 8(*a*)) in the delay ratio adjusting circuit 822, 832, or 842 may be one of values between (n+1) and (2n−1), where n is an integer not smaller than 2. That is, by combining the first number and the second number, each of the adjustment delay elements Da1 to Dan-1 may have a different delay ratio R for basic delay element D. Each of the delay circuits 824, 834, and 844 uses the adjustment delay element at a first stage, whereby an output pulse having a delay amount that is not an integral multiple of the delay amount of the basic delay element D can be generated. In this way, the delay ratio R is generally determined by (the number of basic delay elements)/(the number of adjustment delay elements), and may be a value such as (n+1)/n, (n+2)/n, (n+3)/n, . . . , or (2n−1)/n. Furthermore, the foregoing division may be reducible. For example, 6/4 can be reduced to 3/2. In such a case, the numbers of each type of delay elements may be changed to 3/2 instead of 6/4. More specifically, when n adjustment delay element Da arrays are used, the delay ratios R can be (n−1) different values. By using one adjustment delay element D having the different delay ratio R at the first stage, and serially connecting a plurality of basic delay element (the first delay element D array in FIG. 8(*a*)) to this adjustment delay element, (n−1) delay circuits capable of generating delay pulses having different delay amounts can be formed. The output pulse signals from each delay element in these delay circuits 824, 834, and 844 and output pulses from each delay element of a ring oscillator 810, in which a plurality of basic delay elements (the first delay elements D in FIG. 8(a)) are serially connected, are selected by a selector circuit 880. Pulse signals having various pulse widths can be generated by a pulse waveform shaping circuit 890 from the output pulses selected by the selector circuit 880.

More specifically, as shown in FIG. 8(b), the delay ratios R, determined by (the number of basic delay elements)/(the number of adjustment delay elements), may be (3/2), (5/4, 6/4, 7/4), and (9/8, 10/8, 11/8, . . . , 14/8, 15/8) to increase the compatible resolution by twice, four times, and eight times, respectively. One, four, and seven delayed pulse generation circuit can be formed using delay ratio adjusting circuits having two delay element arrays corresponding to these combinations. Then, pulse width modulation can be performed using output pulses of each of the delayed pulse generation circuits 820, 830, and 840 and output pulses of the basic pulse generation circuit 810. For each delay pulse generation circuit, when the minimum delay step of the basic delay element is 1, available minimum delay steps may be 0.5, 0.25, and 0.125.

Furthermore, the present invention includes a following integrated circuit on which a high-resolution-compatible pulse width modulation (PWM) pulse signal generation device can be formed. The present invention utilizes a property that, in an integrated circuit, e.g., a large scale integrated circuit (LSI), adjacent elements (MOS transistors or the like) have generally equal electric characteristics or the characteristics extremely closely resemble. This integrated circuit includes a circuit for adjusting a delay ratio for basic delay element that uses a reference clock pulse generated with a ring oscillator constituted by a plurality of serially connected basic delay elements. More specifically, in this integrated circuit, a first delay element array in which a first number of basic delay elements are serially connected, a second delay element array in which a second number of adjustment delay elements are serially connected, a delay ratio adjustment PLL control circuit including a phase comparator, a low-pass filter, and a voltage control circuit, and a plurality of basic delay elements constituting a ring oscillator are arranged adjacently. This integrated circuit is characterized in that the integrated circuit includes a delay ratio adjusting circuit having delay elements whose characteristics are uniform or aligned.

Furthermore, preferably, this integrated circuit includes a delayed pulse generation circuit in which a delay ratio adjusting circuit and a delay circuit, corresponding to the delay ratio adjusting circuit, are arranged adjacently. The delay circuit includes a delay element array in which a plurality of basic delay elements are serially connected to one adjustment delay element, arranged as a first stage delay element. Furthermore, as shown in FIG. 8(a), the integrated circuit may include a plurality of delayed pulse generation circuits 820, 830, and 840 arranged adjacently to cope with high resolution.

Figure 12:
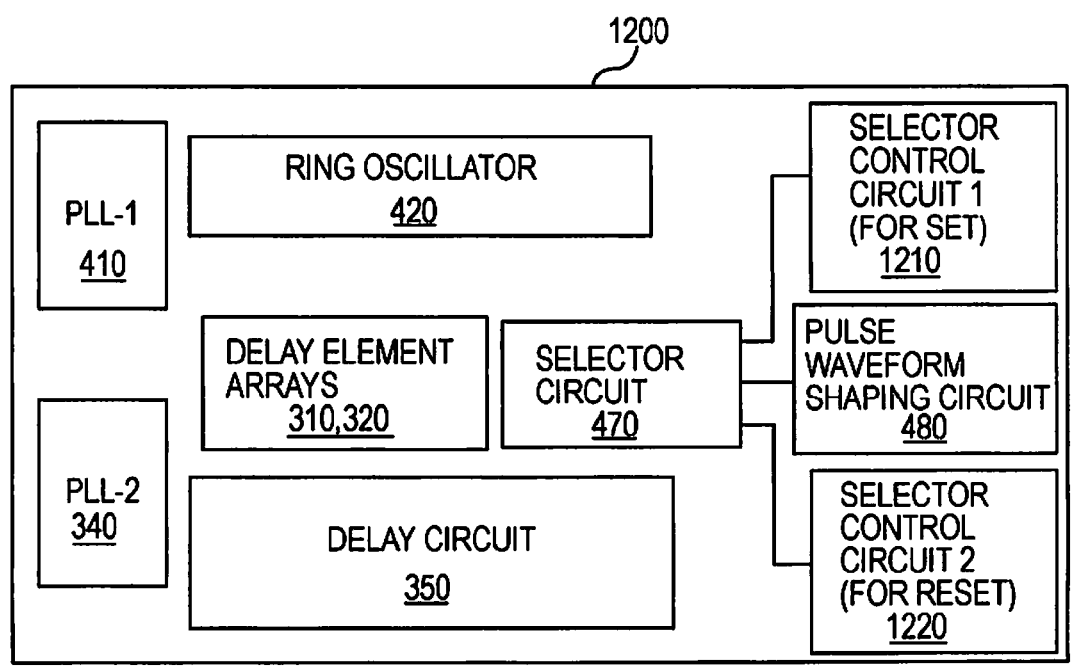
FIG. 12 is a diagram showing an exemplary layout of a pulse signal generation device shown in FIG. 4 on an integrated circuit.

An embodiment of an integrated circuit according to the present invention is shown by a block diagram in FIG. 12. In this integrated circuit 1200, 1) a first PLL control circuit (PLL-1) 410 to which an external clock pulse is input from an external oscillation circuit, 2) a ring oscillator 420 connected to the first PLL control circuit and in which a plurality of basic delay elements (first delay elements) are serially connected, 3) a second PLL control circuit (PLL-2) 340, and 4) a first delay element array 310 in which m basic delay elements (the first delay elements) are serially connected and a second delay element array 320 in which n adjustment delay elements (second delay elements) are serially connected are arranged adjacently. A delay ratio adjusting circuit is constituted by the second PLL control circuit (PLL-2) 340, and two delay element arrays 310 and 320. Preferably, a delay circuit 350 connected to the second PLL control circuit and having the second delay element at the first stage and a plurality of serially connected first delay elements at the second or following stages may be arranged adjacently. Here, a first control voltage (V1) generated by the first PLL control circuit 410 is applied to each of the first delay elements, whereas a second control voltage (V2) generated by the second PLL control circuit is applied to each of the second delay elements. A reference clock pulse is generated by locking an output pulse of the ring oscillator 420 to an external clock pulse from an external oscillation circuit by the first PLL control circuit. A circuit configuration for inputting this reference clock pulse to the first delay element array 310 and the second delay element array 320 of the delay ratio adjustment circuit and the delay circuit 350 is formed on the integrated circuit 1200.

FIG. 12 shows an exemplary layout of a pulse width modulation (PWM) pulse signal generation device shown in FIG. 4 on the integrated circuit 1200. As schematically shown in FIG. 6, the ring oscillator 420, the delay circuit 350, and delay element arrays 310 and 320 that are constituted by delay elements such as the basic delay elements D and the adjustment delay elements Da are arranged adjacently on the integrated circuit, whereby characteristics of each delay element can be made uniform or aligned. In addition, selector control circuits 1210 and 1220 for controlling select signals to a selector circuit 470 can be arranged on the integrated circuit. Furthermore, a plurality of delay ratio adjusting circuits 822, 832, and 842, a plurality of delay circuits 824, 834, and 844, and a basic pulse generation circuit 810 that constitute a pulse signal generation device compatible with high resolution image processing shown schematically in FIG. 8 can be arranged adjacently on the integrated circuit.

While the embodiments of the present invention have been described, the present invention should not be limited to the foregoing embodiments. Additionally, the present invention can be carried out in modes to which various improvements, alterations, and modifications are added on the basis of the knowledge of those skilled in the art without departing from the spirit of the present invention.

The invention claimed is:

1. A delay ratio adjusting circuit for adjusting a delay ratio for a basic delay element using a reference clock pulse generated with a ring oscillator composed of a plurality of serially connected basic delay elements, comprising:

a first delay element array composed of a first number of the serially connected basic delay elements, the reference clock pulse being input to a first basic delay element of the first delay element array and being output from a last basic delay element of the first delay element array;

a second delay element array composed of a second number of serially connected adjustment delay elements, the reference clock pulse being input to a first adjustment delay element of the second delay element array and being output from a last adjustment delay element of the second delay element array; and a PLL control circuit for matching a phase of an output pulse of the first delay element array and a phase of an output pulse of the second delay element array so that a constant delay ratio R of an amount of delay of the adjustment delay element to an amount of delay of the basic delay element is obtained, configured to include a phase comparator having two input terminals, to input an output pulse of the first delay element array to one of the input terminals, to input an output pulse of the second delay element array to the other input terminal, to generate a control voltage in accordance with a phase difference detected by the phase comparator and to apply the control voltage to each of the adjustment delay elements;

wherein another control voltage that another PLL control circuit connected to the ring oscillator generates is applied to each of the basic delay elements of both the ring oscillator and the first delay element array.

2. The delay ratio adjusting circuit according to claim 1, wherein the other PLL control circuit performs loop control and locks a phase of an output pulse of the ring oscillator to a phase of an external clock pulse of an external oscillation circuit to generate the reference clock pulse, and generates the other control voltage on the basis of a phase difference between the reference clock pulse and the external clock pulse.

3. A delayed pulse generation circuit for generating a delayed pulse using a reference clock pulse generated by locking a phase of an output pulse of a ring oscillator composed of a plurality of serially connected basic delay elements to a phase of an external clock pulse of an external oscillation circuit, comprising:

a delay ratio adjusting circuit including:
a first delay element array composed of a first number of serially connected basic delay elements, the reference clock pulse being input to a first basic delay element of the first delay element array and being output from a last basic delay element of the first delay element array;
a second delay element array composed of a second number of serially connected adjustment delay elements, the reference clock pulse being input to a first adjustment delay element of the second delay element array and being output from a last adjustment delay element of the second delay element array, and
a PLL control circuit for matching a phase of an output pulse of the first delay element array and a phase of an output pulse of the second delay element array so that a constant delay ratio R of an amount of delay of the adjustment delay element to an amount of delay of the basic delay element is obtained, configured to include a phase comparator having two input terminals, to input an output pulse of the first delay element array to one of the input terminals, to input an output pulse of the second delay element array to the other input terminal, to generate a control voltage in accordance with a phase difference detected by the phase comparator and to apply the control voltage to each of the adjustment delay elements; and a delay circuit including a delay element having a characteristic that is the same as a characteristic of the adjustment delay elements and to which the reference clock pulse is input and the control voltage is applied, and a plurality of delay elements having a characteristic that is the same as a characteristic of the basic delay elements and serially connected to the delay element, an amount of delay of an output pulse from each of the delay elements of the delay circuit being determined by the delay ratio R, and is not an integral multiple of the amount of delay of the basic delay element;

wherein another PLL control circuit connected to the ring oscillator generates another control voltage, and applies the other control voltage to each of the basic delay elements and the plurality of delay elements having the same characteristic as the basic delay elements.

4. A pulse signal generation device comprising:

a) a first PLL control circuit to which an external clock pulse is input from an external oscillation circuit and for generating a first control voltage;

b) a ring oscillator composed of a plurality of serially connected basic delay elements, the first control voltage being applied to each of the basic delay elements, the ring oscillator performing loop control and locking a phase of an output pulse of the ring oscillator to a phase of the external clock pulse using the first PLL control circuit to generate a reference clock pulse;

c) at least one delay ratio adjusting circuit for adjusting a delay ratio for the basic delay element using the reference clock pulse, the delay ratio adjusting circuit including:
a first delay element array composed of a first number of serially connected basic delay elements, the reference clock pulse being input to a first basic delay element of the first delay element array and being output from a last basic delay element of the first delay element array;
a second delay element array composed of a second number of serially connected adjustment delay elements, the reference clock pulse being input to a first adjustment delay element of the second delay element array and being output from a last adjustment delay element of the second delay element array, and
a second PLL control circuit for matching a phase of an output pulse of the first delay element array and a phase of an output pulse of the second delay element array so that a constant delay ratio R of an amount of delay of the adjustment delay element to an amount of delay of the basic delay element is obtained, the second PLL control circuit including:
a phase comparator having two input terminals, the output pulse of the first delay element array being input to one of the input terminals and an output pulse of the second delay element array being input to the other input terminal, the second PLL control circuit generating a second control voltage in accordance with a phase difference detected by the phase comparator and applying the second control voltage to each of the adjustment delay elements; and d) at least one delay circuit including a delay element having a characteristic that is the same as a characteristic of the adjustment delay elements and to which the reference clock pulse is input and the second control voltage is applied, and a plurality of delay elements having a characteristic that is the same as a characteristic of the basic delay elements and to which the first control voltage is applied and serially connected to the delay elements, an amount of delay of an output pulse from each of the delay elements of the delay circuit being determined by the delay ratio R, and not being an integral multiple of the amount of delay of the basic delay elements, wherein the pulse signal generation device performs pulse width modulation (PWM) using the output pulse of each of the delay elements of the ring oscillator and the output pulse of each of the delay elements of the at least one delay circuit.

5. The pulse signal generation device according to claim 4, wherein the second PLL control circuit includes the phase comparator, a low-pass filter, and a voltage control circuit, the voltage control circuit generating the second control voltage on the basis of the phase difference detected by the phase comparator through the low-pass filter.

6. The pulse signal generation device according to claim 4, further comprising:
a selector circuit for selecting an output pulse from each of the delay elements of the ring oscillator and an output pulse from each of the delay elements of the at least one delay circuit.

7. The pulse signal generation device according to claim 6, further comprising:
a pulse waveform shaping circuit for generating a pulse having various pulse widths from the output pulses selected by the selector circuit.

8. The pulse signal generation device according to claim 4, wherein the delay ratio R is determined by a value (mm) obtained by dividing the first number m by the second number n, and wherein a step of a minimum amount of delay of the output pulse from each of the delay elements of the delay circuit is equal to a value (R−1) obtained by subtracting 1 from the delay ratio R.

9. The pulse signal generation device according to claim 4 wherein the adjustment delay elements having (n−1) different delay ratios, (n+1)/n, (n+2)/n, ..., and (2n−1)/n, are created by means of the delay ratio adjusting circuit using the second delay element array in which the second number n (where n is an integer not smaller than 2) of the adjustment delay elements are serially connected and the first delay element array in which the first number m, equal to one of values between (n+1) and (2n−1), of the basic delay elements are serially connected in combination, the pulse signal generation device includes the (n−1) delay circuits in which a delay element having a characteristic that is the same as a characteristic of each of the adjustment delay elements is used as a first delay element of each of the delay circuits.

10. An integrated circuit including a pulse signal generation device for performing pulse width modulation (PWM), wherein
the pulse signal generation device includes
a) a first PLL control circuit to which an external clock pulse is input from an external oscillation circuit and for generating a first control voltage,
b) a ring oscillator composed of a plurality of serially connected basic delay elements, the first control voltage being applied to each of the basic delay elements, the ring oscillator performing loop control and locking a phase of an output pulse of the ring oscillator to a phase of the external clock pulse using the first PLL control circuit to generate a reference clock pulse,
c) at least one delay ratio adjusting circuit for adjusting a delay ratio for the basic delay element using the reference clock pulse, the delay ratio adjusting circuit including:
a first delay element array composed of a first number of serially connected basic delay elements, the reference clock pulse being input to a first basic delay element of the first delay element array and being output from a last basic delay element of the first delay element array,
a second delay element array composed of a second number of serially connected adjustment delay elements, the reference clock pulse being input to a first adjustment delay element of the second delay element array and being output from a last adjustment delay element of the second delay element array, and
a second PLL control circuit for matching a phase of an output pulse of the first delay element array and a phase of an output pulse of the second delay element array so that a constant delay ratio R of an amount of delay of the adjustment delay element to an amount of delay of the basic delay element is obtained, the second PLL control circuit including a phase comparator having two input terminals, an output pulse of the first delay element array being input to one of the input terminals and an output pulse of the second delay element array being input to the other input terminal, the second PLL control circuit generating a second control voltage in accordance with a phase difference detected by the phase comparator and applying the second control voltage to each of the adjustment delay elements, and
d) at least one delay circuit including a delay element having a characteristic that is the same as a characteristic of the adjustment delay elements and to which the reference clock pulse is input and the second control voltage is applied, and a plurality of delay elements having a characteristic that is the same as a characteristic of the basic delay elements and to which the first control voltage is applied and serially connected to the delay element, an amount of delay of an output pulse from each of the delay elements of the delay circuit being determined by the delay ratio R, and not being an integral multiple of an amount of delay of the basic delay element, wherein
the pulse signal generation device performs pulse width modulation (PWM) using the output pulse of each of the delay elements of the ring oscillator and the output pulse of each of the delay elements of the at least one delay circuit.

* * * * *